United States Patent
Kuriyama

(10) Patent No.: US 7,492,105 B2
(45) Date of Patent: Feb. 17, 2009

(54) METHOD OF DETECTING AN ARC IN A GLOW-DISCHARGE DEVICE AND APPARATUS FOR CONTROLLING A HIGH-FREQUENCY ARC DISCHARGE

(75) Inventor: Noboru Kuriyama, Yokohama (JP)

(73) Assignee: Shibaura Mechatronics Corporation, Kanagawa (JP)

( * ) Notice: Subject to any disclaimer, the term of this patent is extended or adjusted under 35 U.S.C. 154(b) by 0 days.

(21) Appl. No.: 11/873,863

(22) Filed: Oct. 17, 2007

(65) Prior Publication Data

US 2008/0036392 A1 Feb. 14, 2008

Related U.S. Application Data

(60) Division of application No. 10/802,591, filed on Mar. 17, 2004, now Pat. No. 7,301,286, which is a continuation of application No. PCT/JP02/10174, filed on Sep. 30, 2002.

(30) Foreign Application Priority Data

Oct. 22, 2001 (JP) ............... 2001-323977

(51) Int. Cl.
  *G01R 31/00* (2006.01)
  *H05B 41/24* (2006.01)
(52) U.S. Cl. .................... 315/268; 315/269
(58) Field of Classification Search ............... 315/349, 315/350–351, 353, 355, 268, 269–270, 271, 315/273, 275, 283–284
  See application file for complete search history.

(56) References Cited

U.S. PATENT DOCUMENTS 4,177,404 A * 12/1979 Eguchi .................. 315/151
4,709,188 A * 11/1987 Roberts .................. 315/178
5,485,061 A * 1/1996 Ukita et al. ............. 315/307
5,491,386 A * 2/1996 Eriguchi et al. ......... 315/209 R
5,539,303 A * 7/1996 Okazako et al. .......... 324/71.1
5,810,963 A 9/1998 Tomioka
5,968,377 A 10/1999 Yuasa et al.
6,160,362 A * 12/2000 Shone et al. ............. 315/308
6,294,880 B1 9/2001 Deurloo et al.
6,332,961 B1 12/2001 Johnson et al.
6,693,944 B1 2/2004 Hug et al.

FOREIGN PATENT DOCUMENTS

| JP | 55145171 A | 11/1980 |
|---|---|---|
| JP | 59221020 A | 12/1984 |
| JP | 63297559 A | 12/1988 |
| JP | 8167500 A | 6/1996 |
| JP | 9092491 A | 4/1997 |
| JP | 9217171 A | 8/1997 |
| JP | 10154598 A | 6/1998 |
| JP | 2000133412 A | 5/2000 |
| WO | 9914394 A1 | 3/1999 |
| WO | 0016367 A1 | 3/2000 |

* cited by examiner

*Primary Examiner*—Douglas W. Owens
*Assistant Examiner*—Minh Dieu A
(74) *Attorney, Agent, or Firm*—Volpe and Koenig P.C.

(57) ABSTRACT

In a method of detecting arc discharge in a glow-discharge apparatus GD that has a high-frequency power source PS, a cutting pulse is output for time T1 to the high-frequency power source PS to stop a supply of power to the glow-discharge apparatus GD, when $dVr/dt - dVf/dt$ increases over a first level, where Vf and Vr are a traveling-wave voltage and a reflected-wave voltage applied to the glow-discharge apparatus GD, respectively. Arc discharge is determined to have developed in the glow-discharge apparatus, when Vr/Vf increases to a second level or a higher level within a preset time To after the supply of power to the glow-discharge apparatus is stopped.

18 Claims, 4 Drawing Sheets

METHOD OF DETECTING AN ARC IN A GLOW-DISCHARGE DEVICE AND APPARATUS FOR CONTROLLING A HIGH-FREQUENCY ARC DISCHARGE

CROSS REFERENCE TO RELATED APPLICATIONS

This application is a division of U.S. patent application Ser. No. 10/802,591, filed Mar. 17, 2004, now U.S. Pat No. 7,301,286, which is a Continuation Application of PCT Application No. PCT/JP02/10174, filed Sep. 30, 2002, which was not published under PCT Article 21(2) in English, and which are incorporated by reference as if fully set forth.

This application is based upon and claims the benefit of priority from the prior Japanese Patent Application No. 2001-323977, filed Oct. 22, 2001, the entire contents of which are incorporated herein by reference.

BACKGROUND

1. Field of Invention

The present invention relates to a method of detecting an arc and an apparatus for controlling high-frequency arc discharge, which can control arc discharge without stopping the glow discharge in a high-frequency sputtering apparatus or a high-frequency etching apparatus.

2. Description of the Related Art

In the sputtering apparatus, for example, glow discharge is achieved in a predetermined space. Electric power is supplied to the apparatus from a high-frequency power source in order to perform sputtering on, particularly, insulation. During the high-frequency sputtering the glow discharge may abruptly change to arc discharge, inevitably damaging the sample. Generally, the greater the electric power, the more likely arc discharge will occur. That is, as the power is increased to raise the sputtering speed, an arc does not disappear quickly once it has been generated even in a region where arcs are less likely to develop. As the power is further increased, the arc remains in that region and would not disappear.

Apparatuses for controlling arc discharge are known, which are designed to interrupt the supply of power for 200 µs when the glow discharge is detected to have changed to arc discharge.

When this type of an apparatus interrupts the supply of power for 200 µs, however, not only the arc discharge but also the glow discharge is stopped. This is a problem.

An arc-discharge control apparatus is known, which interrupts the supply of power for 5 µs only when the glow discharge is detected to have changed to arc discharge. This apparatus is shown in FIG. 5 and disclosed in Jpn. Pat. Appln. KOKAI Publication No. 2000-133412.

This apparatus will be described with reference to FIG. 5. As FIG. 5 depicts, a high-frequency power source PS is provided, which outputs a high-frequency voltage of 13.56 MHz. The high-frequency power source PS is connected to a target T and a chamber CH by a coaxial cable, a power meter CM, a coaxial cable, an impedance-matching circuit IM and a DC-cutting Cc. Thus, power is supplied from the high-frequency power source PS, applying a voltage between the target T and the chamber CH. "GD" in FIG. 5 is a glow-discharge device.

Reflected-wave voltage Vr and traveling-wave voltage Vf are input to amplifiers 1 and 2, respectively, instead of the traveling-wave voltage and reflected-wave voltage that are acquired from the power meter CM. Further, they are input to a comparator 5 via differentiating circuits 3 and 4, respectively. When the value $dVr/dt - dVf/dt$ reaches the first level set by a level-setting unit 6, which is, for example, 0.2 or more, the comparator 5 outputs an H-level signal to a mono-multi circuit M/M. Upon receipt of the H-level signal, the mono-multi circuit M/M outputs an arc-cutting pulse to the high-frequency power source PS. Note that the arc-cutting pulse has a predetermined length T1, which is, for example, 5 µs.

To be more precise, the mono-multi circuit M/M supplies an arc-cutting pulse to the high-frequency power source PS as shown in FIG. 4B, when the reflected-wave voltage Vr rises to a peak as shown at a in FIG. 4A. The high-frequency power source PS inevitably stops applying a voltage between the target T and the chamber CH. Consequently, the arc discharge cannot be detected even if the reflected-wave voltage Vr changes as shown at b in FIG. 4B. This is because the value $dVr/dt - dVf/dt$ does not exceed the first level. Nor can the arc discharge be detected while the voltage Vr remains at a certain level because the arc keeps existing. That is, the output of the comparator 5 is the value of 0 as long as both the reflected-wave voltage Vr and the traveling-wave voltage Vf stay at certain levels. In this case, the $dVr/dt - dVf/dt$ fail to rise above the first level, making it impossible to detect the arc discharge.

SUMMARY

An object of the present invention is to provide a method of detecting an arc and an apparatus for controlling a high-frequency arc, which can control arc discharge without stopping the glow discharge.

According to an aspect of the present invention, there is provided a method of detecting arc discharge in a glow-discharge apparatus that has a high-frequency power source.

In the method, a cutting pulse is output for time T1 to the high-frequency power source to stop a supply of power to the glow-discharge apparatus, when $dVr/dt - dVf/dt$ increases over a first level, where Vf and Vr are a traveling-wave voltage and a reflected-wave voltage applied to the glow-discharge apparatus, respectively. Arc discharge is determined to have developed in the glow-discharge apparatus, when Vr/Vf increases to a second level or a higher level within a preset time To after the supply of power to the glow-discharge apparatus is stopped.

Thus, an aspect of the invention can provide a method of detecting arc discharge, which can control the arc discharge without stopping the glow discharge.

DETAILED DESCRIPTION OF THE PREFERRED EMBODIMENTS

Figure 1:
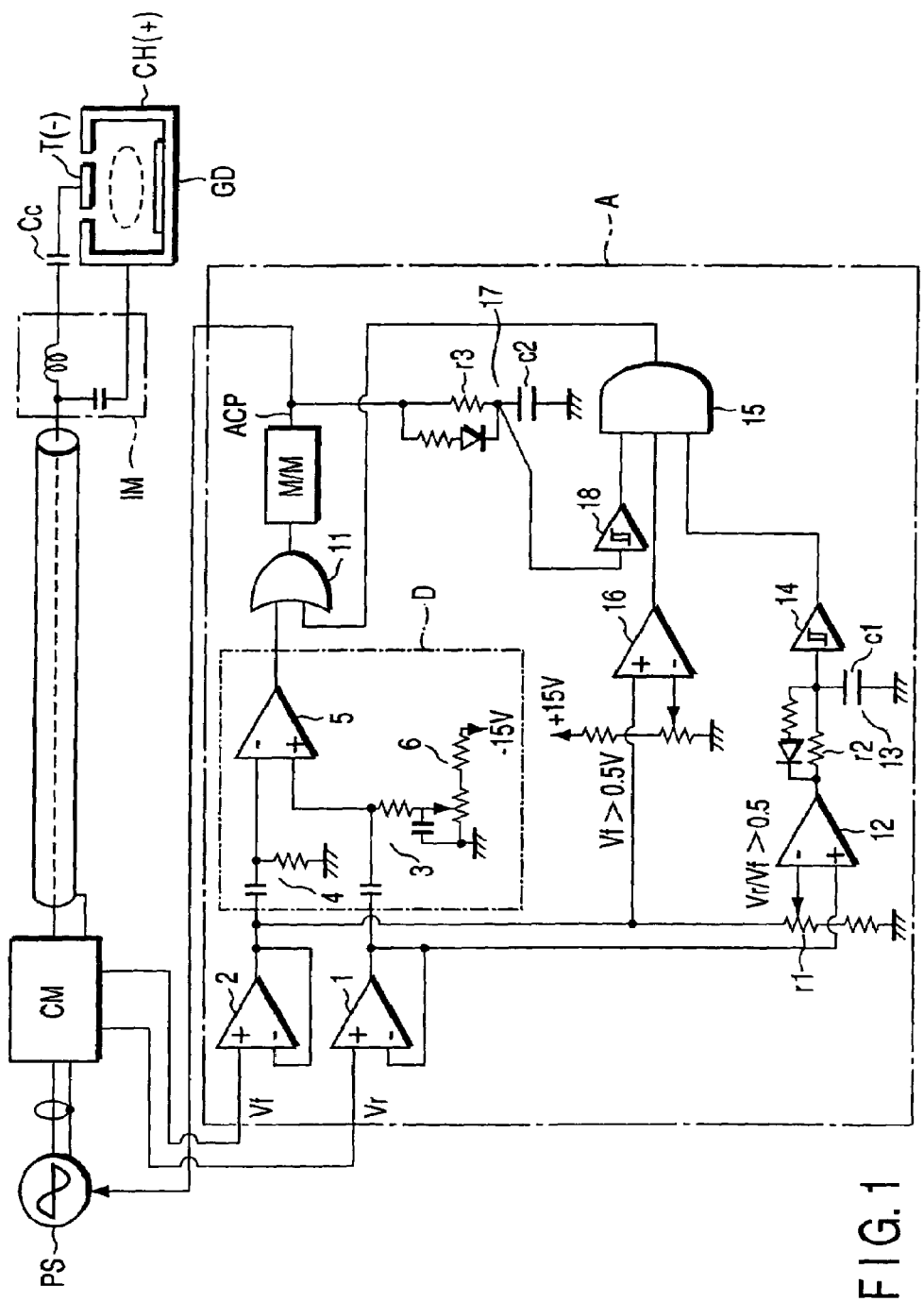
FIG. 1 is a diagram showing a high-frequency arc-discharge control apparatus according to the first embodiment of this invention.
Figure 5:
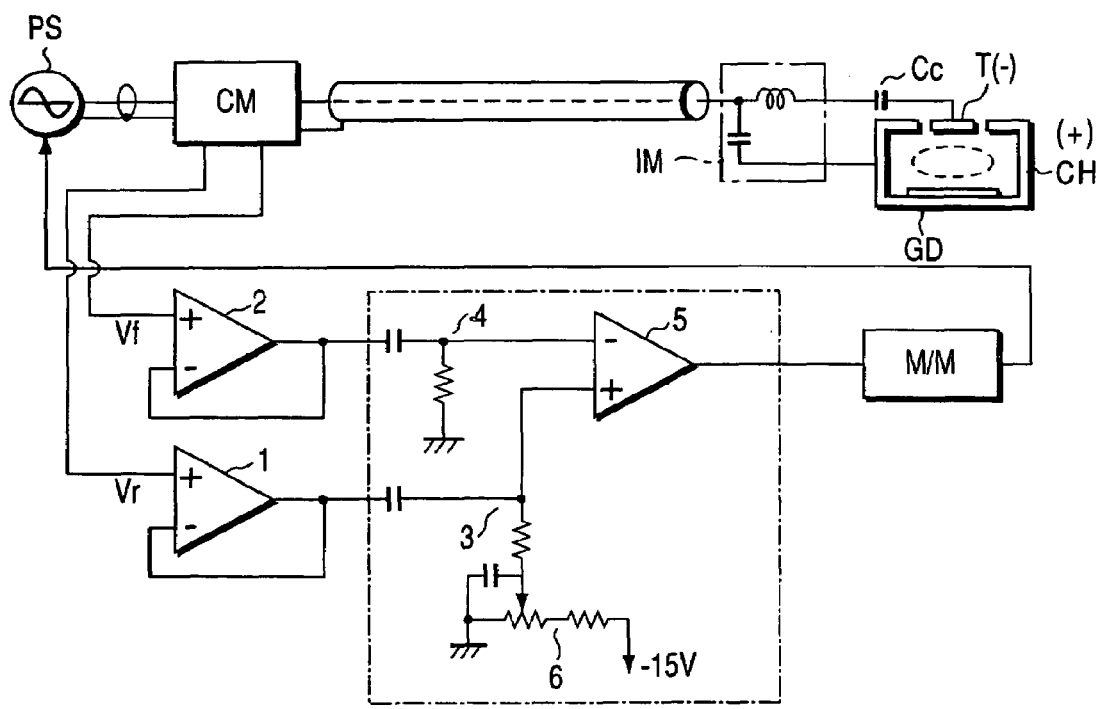
FIG. 5 is diagram showing the conventional apparatus for controlling high-frequency arc discharge.

The first embodiment of this invention will be described, with reference to FIG. 1. In FIG. 1, the components identical to those shown in FIG. 5 are designated at the same reference numerals.

In the first embodiment, the high-frequency power source PS is connected to a target T and a chamber CH by a coaxial cable, a power meter CM, a coaxial cable, an impedance-matching circuit IM and a DC-cutting capacitor Cc. Thus, power is supplied from the high-frequency power source PS, applying a voltage between the target T and the chamber CH. Note that "GD" in FIG. 5 is a glow-discharge device.

As long as glow discharge continues in the glow-discharge device GD, the high-frequency power source PS supplies power to the glow-discharge device GD so that the reflected-wave power and the traveling-wave power may be minimum and maximum, respectively. Thus, neither the reflected-wave power nor the traveling-wave power changes greatly. When arc discharge develops in the glow-discharge device GD, the reflected-wave power abruptly increases. From the sharp increase of the reflected-wave power, it can be detected that arc discharge has developed in the glow-discharge device GD.

When arc discharge occurs in the device GD, the traveling-wave power decreases and the reflected-wave power sharply increase. From the sharp increase of the reflected-wave power it can be detected that the discharge in the device GD has changed from glow discharge to arc discharge.

The power meter CM supplies a reflected-wave voltage Vr and a traveling-wave voltage Vf, instead of the reflected-wave power and traveling-wave power, to amplifiers 1 and 2, respectively. The reflected-wave voltage Vr is applied via a differentiating circuits 3 to a comparator 5. Similarly, the traveling-wave voltage Vf is applied via a differentiating circuit 4 to the comparator 5. This is because the reflected-wave voltage Vr increases in the same way as the reflected-wave power, and the traveling-wave voltage Vf decreases in the same way as the traveling-wave power, when arc discharge develops in the glow-discharge device GD. The comparator 5 and the circuits connected to the comparator 5 constitute the first cutting-pulse output unit.

A level-setting unit 6 is provided, which sets a value of 0.2, i.e., first level. When the value dVr/dt−dVf/dt increases to 0.2 (the first level) or more, the comparator 5 outputs an H-level signal to a mono-multi circuit M/M through an OR circuit 11. In response to the H-level signal, the level-setting unit 6 outputs an arc-cutting pulse cutting pulse) ACP to the high-frequency power source PS. The arc-cutting pulse ACP lasts for a predetermined time T1, for example 5 μs.

In The reflected-wave voltage Vr output from the amplifier 1 is applied to the positive (+) input terminal of a comparator 12. The traveling-wave voltage Vf output from the amplifier 2 is applied to a voltage-dividing resistor r1, which outputs a voltage that is half the input voltage, i.e., Vf/2. Voltage Vf/2 is applied to the negative (−) input terminal of the comparator 12.

When the reflected-wave voltage Vr increases higher than Vf/2, i.e., half the traveling-wave voltage Vf, the comparator 12 detects that arc discharge has developed in the glow-discharge device GD. The comparator 12 outputs a high-level signal when Vr/Vf becomes greater than 0.5, or exceeds the second level Vr/Vf>0.5).

The output of the comparator 12 is input to a Schmidt trigger circuit 14 via a timer circuit 13. The timer circuit 13 comprises a resistor r2 and a capacitor c1 and is reset upon measuring time T2. Time T2 preset in the timer circuit 13 is, for example, 1 μs.

The output of the Schmidt trigger circuit 14 is input to one input terminal of an AND circuit 15.

The traveling-wave voltage Vf output from the amplifier 2 is applied to the positive (+) input terminal of a comparator 16. Applied to the negative (−) input terminal of the comparator 16 is a voltage of 0.5 V, which is 0.05 times the maximum value Vfmax (=10 V) that the traveling-wave voltage Vf can have.

The comparator 16 outputs a H-level signal to one input terminal of the AND circuit 15 when Vf is higher than 0.5 V (Vf>0.5 V). "Vf>0.5 V" means that the high-frequency power source PS is supplying power.

The output of the mono-multi circuit M/M is connected to a timer circuit 17, which in turn is connected to the ground. As shown in FIG. 1, the timer circuit 17 comprises a capacitor c2 and a resistor r3. The capacitor c2 is connected to the ground at one end. The other terminal of the capacitor c2 is connected to a Schmidt trigger circuit 18, which is connected to one input terminal of the AND circuit 15. The timer circuit 17 opens the gate of the AND circuit 15 upon lapse of time To (e.g., 20 μs) from the leading edge of the arc-cutting pulse ACP. The output of the AND circuit 15 is input to one input terminal of the OR circuit 11. In FIG. 1, the components shown in the one-dot, dashed line box constitute an arc-detecting circuit A. Note that the AND circuit 15 and the components connected the input terminals of the AND circuit 15 constitute the second cutting-pulse output unit.

How the first embodiment of this invention operates will be described below.

Figure 4A:
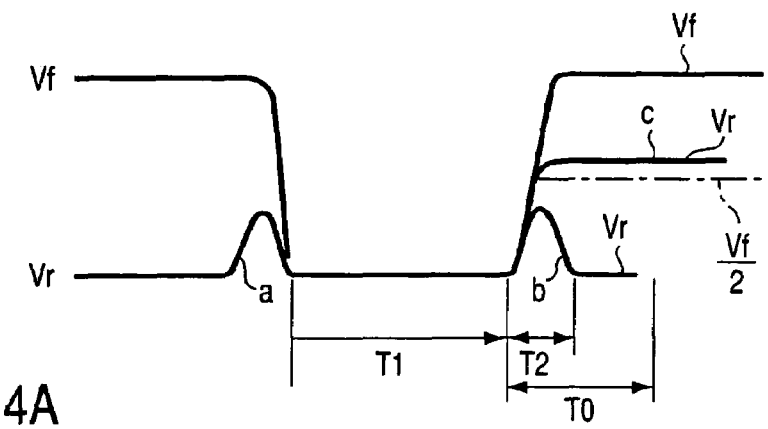
FIGS. 4A and 4B are a timing chart that explains the operation of a conventional apparatus and that of an apparatus of the present invention.
Figure 4B:

When the glow discharge changes to arc discharge in the glow-discharge device GD, the traveling-wave voltage Vf falls, while the reflected-wave voltage Vr rises as indicated at a in FIG. 4A. The mono-multi circuit M/M therefore outputs an arc-cutting pulse ACP to the high-frequency power source PS, for time T1 from time T1 when the comparator 5 outputs a H-level signal. As a result, the high-frequency power source PS stops supplying power for time T1.

Upon lapse of time T1, the power source PS starts supplying power again. The start of the supply of power is detected as the output signal of the comparator 16 rises to H level.

The timer circuit 17 keeps opening the gate of the AND circuit 15 for time To from the end of time T1 (i.e., the trailing edge of the arc-cutting pulse ACP).

When the reflected-wave voltage Vr rises above 0.5 V (see c in FIG. 4A), the output of the comparator 12 rises to H level. When time T2 elapses, or when the timer circuit 13, which has been measuring time since the output of the comparator 12 rose, is reset, the Schmidt trigger circuit 14 outputs a H-level signal. As a result of this, the AND circuit 15 generates a logic products of the inputs. In other words, the AND circuit 15 outputs a H-level signal. The H-level signal is supplied to the mono-multi circuit M/M through the OR circuit 11. The arc-cutting pulse ACP is again output to the high-frequency power source PS. Hence, the supply of power is interrupted for time T1.

Thus, the arc-cutting pulse ACP is output again. Act discharge may be detected before time To, which initiates at the trailing edge of the arc-cutting pulse ACP, elapses. In this case, the AND gate 15 generates a logic product of the three inputs, whereby the mono-multi circuit M/M outputs an arc-cutting pulse ACP.

The arc-cutting pulse ACP is supplied to the power supply source PS until the arc discharge stops in the glow-discharge device GD.

In the first embodiment of the invention, the output of the comparator 5 is monitored. Thus, whether the AND circuit 15 generates a logic product is determined even after it is detected that arc discharge has developed in the glow-discharge device GD. Thus, the mono-multi circuit M/M keeps outputting an arc-cutting pulse ACP until the arc discharge stops. That is, the arc discharge can be reliably eliminated.

The second embodiment of this invention will be described with reference to FIG. 2. The components identical to those shown in FIG. 1 are designated at the same reference numerals in FIG. 2 and will not be described in detail.

Figure 2:
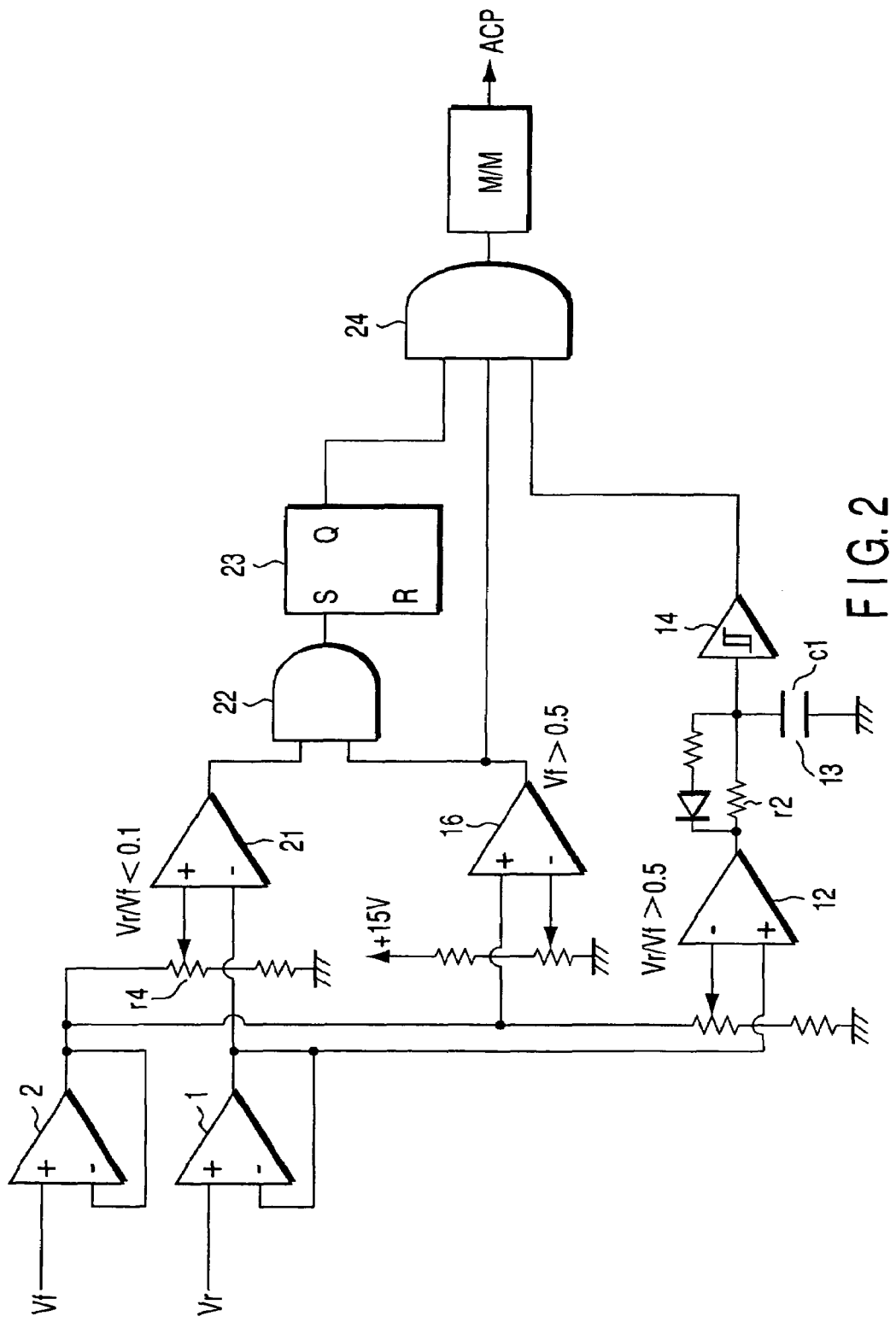
FIG. 2 is a diagram depicting a high-frequency arc-discharge control apparatus according to the second embodiment of the present invention.

FIG. 2 is a circuit diagram of the arc-detecting circuit provided according to the second embodiment, which differs from the arc-detecting circuit A illustrated in FIG. 1. Note that the inputs to the comparators 12 and 16 are just the same as in the arc-detecting circuit A of FIG. 1.

The circuit shown in FIG. 2 has a comparator 21 that can detect that matching has been achieved.

The positive (+) input terminal of the comparator 21 receives one-tenth (1/10) of the traveling-wave voltage Vf output from the amplifier 2, through a voltage-dividing resistor r4. That is, the comparator 21 outputs a H-level signal when Vr/Vf becomes less than 0.1 (third level) (Vr/Vf<0.1), determining that the matching has been achieved.

The outputs of the comparators 16 and 21 are input to an AND circuit 22. The output of the AND circuit 22 is input to the S terminal of an S-R flip-flop 23. Thus, the S-R flip-flop 23 is set when the AND circuit 22 generates a logic product of the output levels of the comparators 16 and 21.

The output of the S-R flip-flop 23 is input to one input terminal of an AND circuit 24. Note that the output of the comparator 16 and the output of the Schmidt trigger circuit 14 are input to one input terminal of the AND circuit 24.

The output of the AND circuit 24 is input to mono-multi circuit M/M. The mono-multi circuit M/M outputs an arc-cutting pulse ACP to the high-frequency power source PS.

How the second embodiment described above operates will be described below.

In the second embodiment, the S-R flip-flop 23 stores the data showing that the matching has been achieved. Hence, such differentiating circuits as shown in box D in FIG. 1 are not required.

The other operation of the second embodiment, i.e., the outputting of the arc-cutting pulse ACP when generating a logic product of the output levels of the comparators 16 and 21, is the same as in the first embodiment described above.

Figure 3:
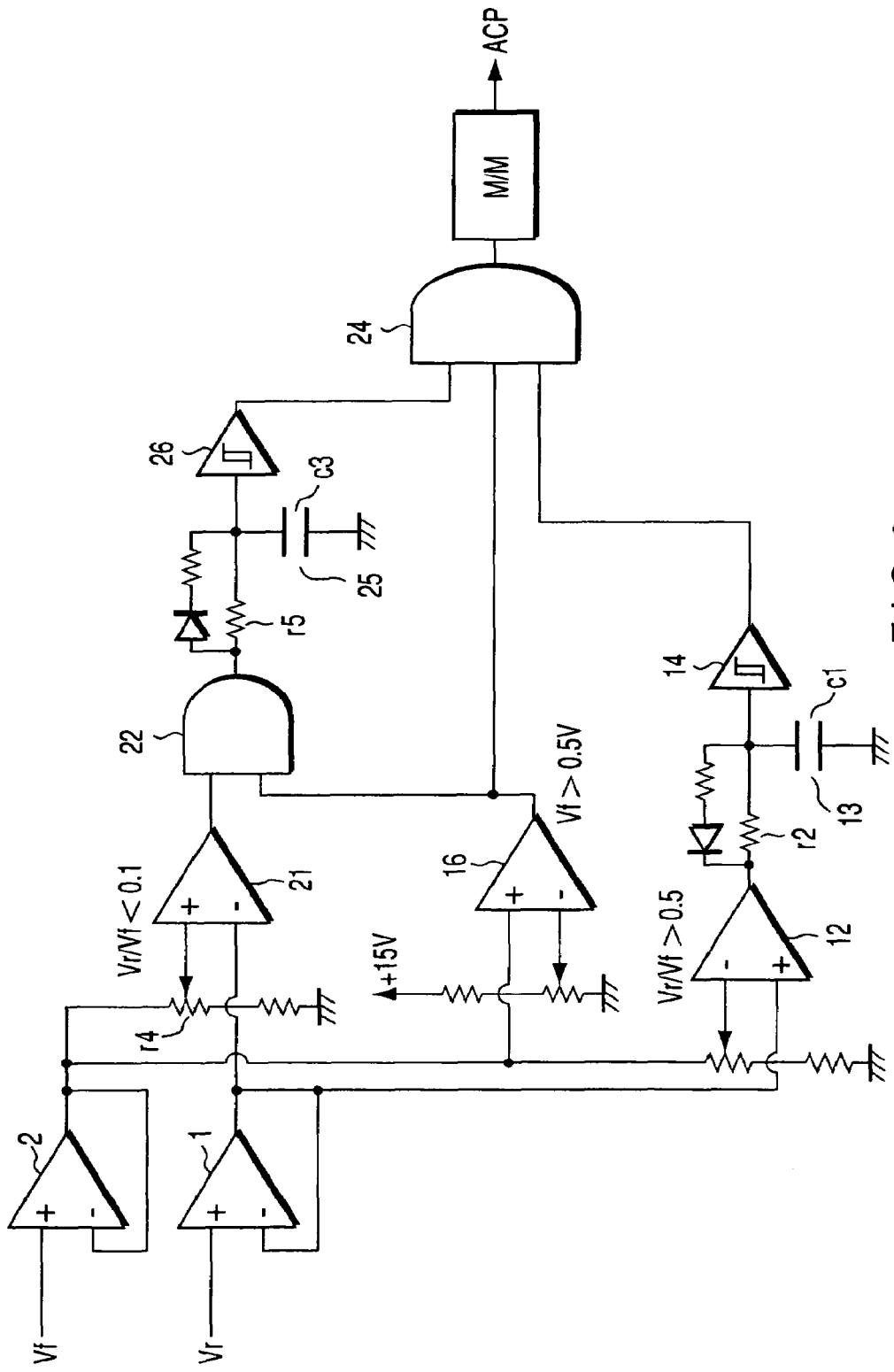
FIG. 3 is a diagram illustrating a high-frequency arc-discharge control apparatus according to the third embodiment of the present invention.

The third embodiment of the invention will be described with reference to FIG. 3. The components identical to those shown in FIG. 2 are designated at the same reference numerals in FIG. 3 and will not be described in detail. The circuit of FIG. 3 has a timer circuit 25 and a Schmidt circuit 26 that are connected in series between the AND circuits 22 and 24 which are identical to those shown in FIG. 2. The timer circuit 25 comprises a resistor r5 and a capacitor c3.

In the third embodiment, no arc-cutting pulse ACP can be output when the matching slowly shifts to make Vr/Vf greater than 0.5 (Vr/Vf>0.5). This is because the timer circuit 25 comprising the resistor r5 and capacitor c3 and the Schmidt circuit 26 is connected in series between the AND circuits 22 and 24.

The timer circuit 13, which is reset upon measuring time T2, may not be used in the third embodiment, while it cannot be dispensed with in the first and second embodiments.

Preset time To mentioned above may be 5 to 100 μs. Time T1 may be 2 to 10 μs, and time T2 may be 0.5 to 5 μs. The first level may range from Vfmax*0.05 to Vfmax*0.2. The second level may range from 0.5 to 0.95. The third level may range from 0.05 to 0.5. Preferably, the first level, second level and third level may be Vfmax*0.2, 0.5 and 0.1, respectively.

Furthermore, Vf>Vfmax*0.05 may be applied as an additional condition for generating a logic product that indicates arc discharge.

Thus, the present invention can provide a method of detecting an arc and an apparatus for controlling a high-frequency arc, which can control arc discharge without stopping the glow discharge.

What is claimed is:

1. A method of detecting arc discharge in a glow-discharge apparatus that has a high-frequency power source, in which a cutting pulse is output for a time T1 to the high-frequency power source to stop a supply of power to the glow-discharge apparatus, when $dVr/dt-dVf/dt$ increases over a first level, where Vf and Vr are a traveling-wave voltage and a reflected-wave voltage applied to the glow-discharge apparatus, respectively; and arc discharge is determined to have developed in the glow-discharge apparatus, when Vr/Vf increases to a second level or a higher level and Vf becomes greater than Vfmax×0.05 within a preset time To during which the supply of power is re-started after the supply of power to the glow-discharge apparatus is stopped during the time T1.

2. The method of detecting arc discharge, according to claim 1, wherein the arc discharge is determined to have developed when Vr/Vf remains at the second level or a higher level for time T2 or longer.

3. The method of detecting arc discharge, according to claim 2, wherein the first level ranges from Vfmax*0.05 to Vfmax*0.2, and the second level ranges from 0.5 to 0.95.

4. The method of detecting arc discharge, according to claim 2, wherein the preset time To is measured, starting at a trailing edge of the cutting pulse.

5. The method of detecting arc discharge, according to claim 1, wherein the preset time To is measured, starting at a trailing edge of the cutting pulse.

6. A method of detecting arc discharge in a glow-discharge apparatus that has a high-frequency power source, in which a cutting pulse is output for a time T1 to the high-frequency power source to stop a supply of power to the glow-discharge apparatus, when $dVr/dt-dVf/dt$ increases over a first level, where Vf and Vr are a traveling-wave voltage and a reflected-wave voltage applied to the glow-discharge apparatus, respectively; arc discharge is determined to have developed in the glow-discharge apparatus, when Vr/Vf increases to a second level or a higher level and Vf becomes greater than Vfmax×0.05 within a preset time To during which the supply of power is re-started after the supply of power to the glow-discharge apparatus is stopped; and the supply of power to the glow-discharge apparatus is further stopped for time T1 after the arc discharge is detected again during the preset time To.

7. The method of detecting arc discharge, according to claim 6, wherein the arc discharge is determined to have developed when Vr/Vf remains at the second level or a higher level for time T2 or longer.

8. The method of detecting arc discharge, according to claim 6, wherein the preset time To is measured, starting at a trailing edge of the cutting pulse.

9. A high-frequency arc-discharge control apparatus comprising:
- a glow-discharge apparatus which receives power from a high-frequency power source through a power meter and an impedance-matching circuit;
- a first cutting-pulse output unit which outputs a cutting pulse for a time T1 to the high-frequency power source when $dVr/dt-dVf/dt$ increases over a first level, where Vf and Vr are a traveling-wave voltage and a reflected-wave voltage applied from the power meter, respectively; and
- a second cutting-pulse output unit which outputs the cutting pulse again for time T1 to the high-frequency power source when Vr/Vf increases over a second level and Vf becomes greater than Vfmax×0.05 within a preset time To during which the supply of power is re-started after the first cutting-pulse output unit outputs a cutting pulse during the time T1.

10. The high-frequency arc-discharge control apparatus according to claim 9, wherein the first level ranges from Vfmax*0.05 to Vfmax*0.2, the second level ranges from 0.5 to 0.95.

11. The high-frequency arc-discharge control apparatus according to claim 9, wherein the second cutting-pulse output unit determines that the arc discharge has developed, when Vr/Vf remains at the second level or a higher level for time T2 or longer.

12. The high-frequency arc-discharge control apparatus according to claim 11, wherein the first level ranges from Vfmax*0.05 to Vfmax*0.2, and the second level ranges from 0.5 to 0.95.

13. The high-frequency arc-discharge control apparatus according to claim 11, wherein the preset time To is measured, starting at a trailing edge of the cutting pulse.

14. The high-frequency arc-discharge control apparatus according to claim 9, wherein the preset time To is measured, starting at a trailing edge of the cutting pulse.

15. A high-frequency arc-discharge control apparatus comprising:
- a glow-discharge apparatus which receives power from a high-frequency power source through a power meter and an impedance-matching circuit;
- a first cutting-pulse output unit which outputs a cutting pulse for a time T1 to the high-frequency power source when $dVr/dt-dVf/dt$ increases over a first level, where Vf and Vr are a traveling-wave voltage and a reflected-wave voltage applied from the power meter, respectively; and
- a second cutting-pulse output unit which outputs the cutting pulse again for time T1 to the high-frequency power source when Vr/Vf increases over a second level and Vf becomes greater than Vfmax×0.05 within a preset time To during which the supply of power is re-started after the first cutting-pulse output unit outputs a cutting-pulse, and outputs the cutting pulse again for time T1 to the high-frequency power source when Vr/Vf increases over a second level and Vf becomes greater than Vfmax× 0.05 within a preset time To after outputting the cutting pulse to the high-frequency power source.

16. The high-frequency arc-discharge control apparatus according to claim 15, wherein the first level ranges from Vfmax*0.05 to Vfmax*0.2, the second level ranges from 0.5 to 0.95.

17. The high-frequency arc-discharge control apparatus according to claim 15, wherein the second cutting-pulse output unit determines that the arc discharge has developed, when Vr/Vf remains at the second level or a higher level for time T2 or longer.

18. The high-frequency arc-discharge control apparatus according to claim 15, wherein the preset time To is measured, starting at a trailing edge of the cutting pulse.

* * * * *